United States Patent
Tsutsui

(10) Patent No.: US 8,987,023 B2
(45) Date of Patent: Mar. 24, 2015

(54) LIGHT EMITTING DEVICE AND MANUFACTURING METHOD THEREOF

(71) Applicant: Samsung Electronics Co., Ltd., Suwon-si, Gyeonggi-do (KR)

(72) Inventor: Tsuyoshi Tsutsui, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 14/109,386

(22) Filed: Dec. 17, 2013

(65) Prior Publication Data

US 2014/0106486 A1 Apr. 17, 2014

Related U.S. Application Data

(63) Continuation of application No. 13/289,504, filed on Nov. 4, 2011, now Pat. No. 8,633,504.

(30) Foreign Application Priority Data

Nov. 10, 2010 (KR) .......................... 10-2010-0111705

(51) Int. Cl.
*H01L 21/00* (2006.01)
*H01L 33/50* (2010.01)
*H01L 25/075* (2006.01)
*H01L 33/56* (2010.01)
*H01L 33/60* (2010.01)

(52) U.S. Cl.
CPC ............. *H01L 33/50* (2013.01); *H01L 25/0753* (2013.01); *H01L 33/505* (2013.01); *H01L 33/56* (2013.01); *H01L 33/60* (2013.01); *H01L 2224/48091* (2013.01); *H01L 2924/3025* (2013.01)
USPC ............... 438/27; 257/E33.061; 257/E33.072

(58) Field of Classification Search
CPC ....................................................... H01L 33/50
USPC ....................... 438/27; 257/E33.061, E33.072
See application file for complete search history.

(56) References Cited

U.S. PATENT DOCUMENTS

2010/0123151 A1 5/2010 Hata et al.
2011/0309398 A1 12/2011 Ito et al.

FOREIGN PATENT DOCUMENTS

| CN | 101740710 A | 6/2010 |
| CN | 101807659 A | 8/2010 |
| CN | 201556639 U | 8/2010 |
| JP | 2002118293 A | 4/2002 |

OTHER PUBLICATIONS

Chinese Office Action issued in Chinese Application No. 201110359328.9 dated Jul. 29, 2014, w/English translation.
Chinese Office Action issued in Application No. 201110359328.9 dated Nov. 28, 2013.
Entire Prosecution History of U.S. Appl. No. 13/289,504, filed Nov. 4, 2011, entitled Light Emitting Device and Manufacturing Method Thereof.

*Primary Examiner* — David S Blum
(74) *Attorney, Agent, or Firm* — McDermott Will & Emery, LLP

(57) ABSTRACT

A light emitting device includes: a substrate; a light emitting element disposed on the substrate; a wavelength conversion unit disposed on the substrate to cover at least an upper surface of the light emitting element; and a reflection unit formed to cover a side surface and a lower surface of the substrate and having a resin and a reflective filler dispersed in the resin. Light emitting devices having uniform characteristics can be obtained by minimizing a chromaticity distribution of white light with respect to the different light emitting devices.

15 Claims, 4 Drawing Sheets

LIGHT EMITTING DEVICE AND MANUFACTURING METHOD THEREOF

CROSS-REFERENCE TO RELATED APPLICATIONS

This application is a Continuation of U.S. application Ser. No. 13/289,504 now U.S. Pat. No. 8,633,504, filed Nov. 4, 2011, which claims the priority of Korean Patent Application No. 10-2010-0111705 filed on Nov. 10, 2010, in the Korean Intellectual Property Office, the disclosure of which is incorporated herein by reference.

BACKGROUND OF THE INVENTION

1. Field of the Invention

The present invention relates to a light emitting device and a manufacturing method thereof.

2. Description of the Related Art

A light emitting diode, a type of semiconductor light emitting device, is a semiconductor device capable of generating light of various colors according to electron hole recombination in p and n type semiconductor junction parts when current is applied thereto. Compared with a light emitting device based on a filament, the semiconductor light emitting device has various advantages such as a long life span, low power consumption, excellent initial driving characteristics, high vibration resistance, and the like, so demand for the semiconductor light emitting device continues to grow. In particular, recently, a group III-nitride semiconductor capable of emitting short-wavelength blue light has come to prominence.

In general, an LED is mounted on a substrate in a chip state or a package state so as to be used as a light emitting module. The light emitting module includes a fluorescent material (or phosphor), or the like, so light of a different wavelength from that emitted from an LED may be obtained. White light emission can be implemented by the fluorescent material. However, although LEDs have the same characteristics, the position or density of fluorescent materials in LED packages may not be uniform, making white light characteristics different, to cause chromaticity distribution (chromatic dispersion, color dispersion).

SUMMARY OF THE INVENTION

An aspect of the present invention provides a light emitting device having uniform characteristics by minimizing a chromaticity distribution of white light with respect to the different light emitting devices.

Another aspect of the present invention provides a method for effectively manufacturing the foregoing light emitting devices.

According to an aspect of the present invention, there is provided a light emitting device including: a substrate; a light emitting element disposed on the substrate; a wavelength conversion unit disposed on the substrate to cover at least an upper surface of the light emitting element; and a reflection unit formed to cover a side surface and a lower surface of the substrate and having a resin and a reflective filler dispersed in the resin.

The light emitting device may further include: first and second terminals disposed on the light emitting element, and the wavelength conversion unit may be formed to cover the sides of the first and second terminals.

The wavelength conversion unit may be formed to cover the side of the light emitting element.

The wavelength conversion unit may be formed so as not to cover the side of the substrate.

The side of the wavelength conversion unit and the side of the reflection unit may be coplanar.

The wavelength conversion unit may have a shape of a thin film.

The reflection unit may be formed so as not to cover the side of the light emitting element.

According to an aspect of the present invention, there is provided a light emitting device including: a substrate; a light emitting element disposed on the substrate; a wavelength conversion unit disposed on the substrate to cover an upper surface and a side surface of the light emitting element; and a reflection unit formed to cover a side surface and a lower surface of the substrate and having one side formed to be coplanar with the side of the wavelength conversion unit.

The reflection unit may include a resin and a reflective filler dispersed in the resin.

The wavelength conversion unit may be formed so as not to cover the side of the substrate.

The reflection unit may be formed so as not to cover the side of the light emitting element.

According to an aspect of the present invention, there is provided a method for manufacturing a light emitting device, including: arranging a plurality of light emission structures, each including a substrate and a light emitting element disposed on the substrate, on a carrier sheet such that the light emitting elements face a lower side; forming a reflection unit to cover an upper surface and a side surface of each of the substrates; and forming a wavelength conversion unit on at least one surface of each of the light emitting elements exposed by removing the carrier sheet.

At least two of the plurality of substrates may have different thicknesses.

In the arranging of the plurality of light emission structures on the carrier sheet, at least portions of the light emitting elements may be buried in the carrier sheet.

In the arranging of the plurality of light emission structures on the carrier sheet, one surface of each of the substrates may be in contact with the carrier sheet.

In the forming of the wavelength conversion unit, the wavelength conversion unit may have the same thickness with respect to each of the light emitting elements.

The method may further include: forming first and second terminals on at least one surface of each of the light emitting elements exposed by removing the carrier sheet before forming the wavelength conversion unit, wherein the wavelength conversion unit may be formed to cover the sides of the first and second terminals.

The forming of the wavelength conversion unit may include: forming the wavelength conversion unit such that it covers the sides of the first and second terminals; and removing a portion of the wavelength conversion unit to expose at least upper surfaces of the first and second terminals.

In the removing of a portion of the wavelength conversion unit, portions of the first and second terminals may be also removed.

As the portions of the wavelength conversion unit and the first and second terminals are removed, the upper surfaces of the wavelength conversion unit and the first and second terminals may be coplanar.

In the forming of the wavelength conversion unit, the wavelength conversion unit may be integrally formed with the plurality of light emission structures.

Each of the light emitting elements may have first and second electrodes, and the wavelength conversion unit may be formed to cover the sides of the first and second electrodes and expose at least one surface of each of the first and second electrodes.

In the forming of the reflection unit, the reflection unit may be formed to have the same thickness with respect to each of the light emitting elements.

In the forming of the reflection unit, the reflection unit may be integrally formed with the plurality of light emission structures.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
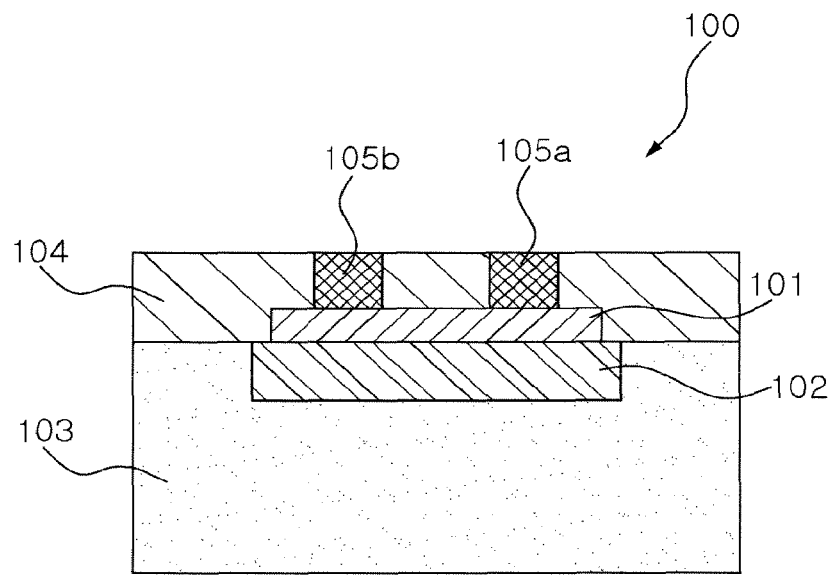
FIG. 1 is a schematic sectional view of a light emitting device according to an exemplary embedment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 2:
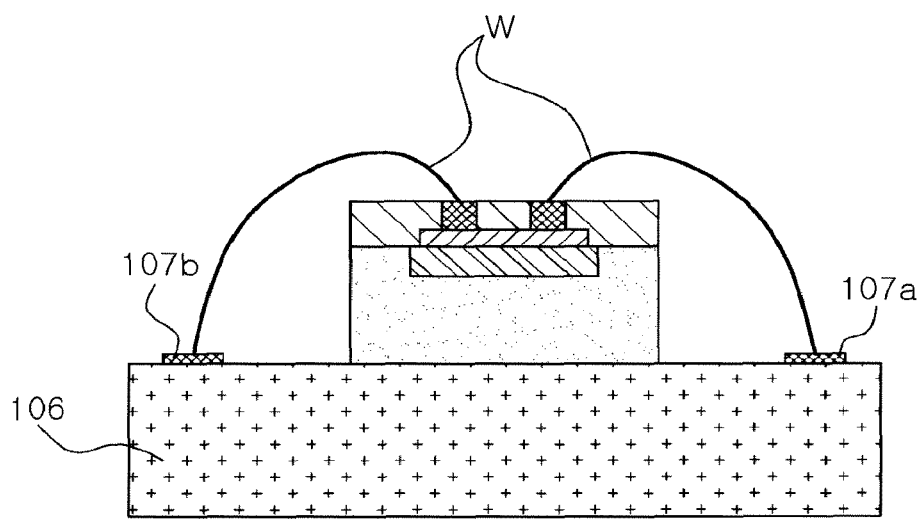
FIG. 2 is a schematic sectional view showing an example of a light emitting apparatus having the light emitting device of FIG. 1.

FIG. 1 is a schematic sectional view of a light emitting device according to an exemplary embedment of the present invention. FIG. 2 is a schematic sectional view showing an example of a light emitting apparatus having the light emitting device of FIG. 1. First, with reference to FIG. 1, a light emitting device 100 according to an exemplary embedment of the present invention includes a light emitting element 101, a substrate 102, a reflection unit 103, a wavelength conversion unit 104, and terminals 105a and 150b. Referring to the disposition relationships of the respective constituents, the light emitting element 101 is disposed on the substrate 102, and the wavelength conversion unit 104 is disposed on the substrate 104 to cover an upper surface and a side surface of the light emitting element 101. Also, as shown in FIG. 1, the wavelength conversion unit 104 covers the sides of the first and second terminals 105a and 105b, and upper surfaces of the first and second terminals 105a and 105b are exposed. The reflection unit 103 is formed to cover a side surface and a lower surface of the substrate 102.

The light emitting element 101 may be any element so long as it can emit light, and a light emitting diode (LED) may be used as the light emitting element 101. In this case, although not shown, the light emitting element 101 may include first and second conductive semiconductor layers and an active layer disposed therebetween. The light emitting element emits light of a certain energy as electrons and holes are recombined in the active layer. The substrate 102 may be made of a material such as sapphire, Si, SiC, or the like, and provided to allow layers constituting the light emitting element 101 to be grown thereon, and it may not be a growth substrate. Namely, the substrate 102 may be bonded with the light emitting element 101 after the light emitting element 101 is completely grown. Meanwhile, the layers constituting the light emitting element 101 may be made of nitride semiconductor, e.g., $Al_xIn_yGa_{(1-x-y)}N$ ($0 \leq x \leq 1$, $0 \leq y \leq 1$, $0 \leq x+y \leq 1$).

Besides the nitride semiconductor, a GaAs-based semiconductor or a GaP-based semiconductor may be also used to form the light emitting element 101. The light emitting element 101 may include first and second electrodes (which correspond to 108a and 108b in FIG. 9) electrically connected to the first and second conductive semiconductor layers, and the first and second electrodes may be connected to the first and second terminals 105a and 105b. The first and second electrodes and the first and second terminals 105a and 105b may exist separately or may be integrally formed. As shown in FIG. 2, the light emitting device 100 illustrated in FIG. 1 may be disposed on a substrate 106 so as to be used as a light emitting apparatus, and in this case, the first and second terminals 105a and 105b may be connected to first and second electrode patterns 107a and 107b formed on the substrate 106 through conductive wires (W), or the like.

The reflection unit 103 is formed to cover the side surface and the lower surface of the substrate 102 and serves to upwardly guide light emitted from the light emitting element 101. In this case, as shown in FIG. 1, the reflection unit 103 is formed so as not to cover the side surface of the light emitting element 101, and the side of the reflection unit 103 and at least one side of the wavelength conversion unit 104 are coplanar. This structure can be obtained through a process (to be described) of providing the wavelength conversion unit 104 with a uniform thickness with respect to a different light emitting element 101. In order to perform a reflection function, the reflection unit 103 may be made of any material so long as it can perform a light reflection function, and preferably, the reflection unit 103 is made of an electrically insulating material over the possibility that it may be in contact with the light emitting element 101, or the like. For example, the reflection unit 103 may include a low refractive index resin and a reflective filler dispersed in the resin. In this case, the reflective filler may be made of a light reflective oxide such as $TiO_2$, $SiO_2$, or the like. Also, the resin constituting the reflection unit 103 may be a silicon resin or an epoxy resin, and in this case, the resin may have a low refractive index, e.g., approximately, a refractive index of 1.5 or lower, in order to increase the reflection performance thereof.

The wavelength conversion unit 104 serves to convert the wavelength of light emitted from the light emitting element 101 into a different wavelength. The wavelength conversion unit 104 may have the form of a thin film to cover at least a portion, e.g., an upper surface and a side surface in the present exemplary embodiment, of a light emission surface of the light emitting element 101. Because the wavelength conversion unit 104 is provided in the form of a thin film, it can have a relatively uniform shape and thickness, minimizing a color variation of white light in a light emission direction and also reducing color dispersion between different devices. Also, as shown in FIG. 1, the wavelength conversion unit 104 may be formed to cover the sides of the first and second terminals 105a and 105b, as well as cover the light emitting element 101. The wavelength conversion unit 104 does not cover the side of the substrate 102 and may be formed such that one side thereof is coplanar with the side of the reflection unit 103. With this structure, the wavelength conversion unit 104 can be applied with a relatively uniform thickness and shape to the light emitting element 101, details of which will be described later.

Meanwhile, in order to perform a light conversion function, the wavelength conversion unit 104 may include a wavelength conversion material such as a phosphor, a quantum dot, or the like. In this case, the wavelength conversion material may be used to have a plate structure including the wavelength conversion material alone, or may be used to have a film structure in which the wavelength conversion material is dispersed in a silicon resin, or the like. In this case, when the wavelength conversion material is phosphor and blue light is emitted from the light emitting element 101, red phosphor may include nitride phosphor of $MAlSiNx:Re$ ($1 \leq x \leq 5$), sulphide phosphor of $MD:Re$, and the like. Here, M is at least one selected from among Ba, Sr, Ca, and Mg, and D is at least one selected from among S, Se, and Te, Re is at least one selected from among Eu, Y, La, Ce, Nd, Pm, Sm, Gd, Tb, Dy, Ho, Er, Tm, Yb, Lu, F, Cl, Br, and I. Also, green phosphor may include silicate phosphor of $M_2SiO_4:Re$, sulphide phosphor of $MA_2D_4:Re$, phosphor of $\beta$-SiAlON:Re, and oxide-based phosphor of $MA'_2O_4:Re'$, and the like. Here, M may be at least one selected from among Ba, Sr, Ca, and Mg, A may be at least one selected from among Ga, Al, and In, D may be at least one selected from among S, Se, and Te, A' may be at least one selected from among Sc, Y, Gd, La, Lu, Al, and In, Re may be at least one selected from among Eu, Y, La, Ce, Nd, Pm, Sm, Gd, Tb, Dy, Ho, Er, Tm, Yb, Lu, F, Cl, Br, and I, and Re' may be at least one selected from among Ce, Nd, Pm, Sm, Tb, Dy, Ho, Er, Tm, Yb, F, Cl, Br, and I.

The quantum dot is a nano-crystal particle including a core and a shell, and the core size ranges from 2 nm to 100 nm. The quantum dot may be used as phosphor emitting various colors such as blue (B), yellow (Y), green (G), and red (R), and at least two types of semiconductor among II-VI group compound semiconductor (ZnS, ZnSe, ZnTe, CdS, CdSe, CdTe, HgS, HgSe, HgTe, MgTe, etc.), III-V group compound semiconductor (GaN, GaP, GaAs, GaSb, InN, InP, InAs, InSb, AlAs, AlP, AlSb, AlS, etc.), or IV group semiconductor (Ge, Si, Pb, etc.) may be hetero-junctioned to form a core and shell structure constituting a quantum dot.

In this case, in order to terminate molecular binding on a surface of the shell of the quantum dot at an outer edge of the shell, restrain the cohesion of the quantum dot and improve the dispersion characteristics of the resin such as the silicon resin, the epoxy resin, or the like, or improve the phosphor function, an organic ligand, using a material such as oleic acid, may be formed.

Figure 3:
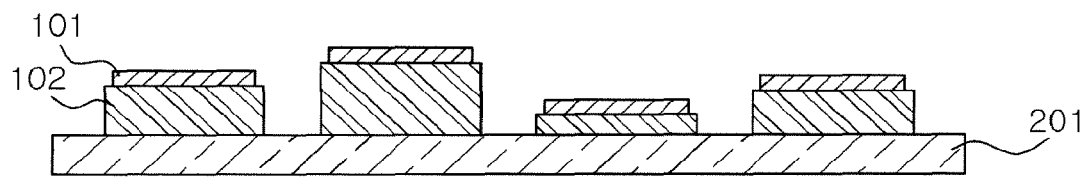
FIGS. 3 to 9 are schematic views sequentially showing a process of a method for manufacturing a light emitting device according to an exemplary embodiment of the present invention.

A method for manufacturing a light emitting device having the foregoing structure will now be described. FIGS. 3 to 9 are schematic views sequentially showing the process of a method for manufacturing a light emitting device according to an exemplary embedment of the present invention. In the manufacturing method according to the present exemplary embodiment, first, as shown in FIG. 3, a plurality of light emission structures are arranged on a first carrier sheet 201. Here, the light emission structure refers to a structure including the light emitting element 101 and the substrate 102. In the present exemplary embodiment, the light emitting elements 101 provided in the plurality of light emission structures may be classified to have a similar light emission wavelength, luminance, and the like, but may have substrates each having a different thickness. Although the characteristics of the light emitting elements 101 have similar characteristics, because they are formed through different processes, the substrates 102 of the light emitting elements 101 may have a different thickness, respectively, making it difficult to apply phosphors thereto with the same thickness and shape. In addition, even though the same shape of phosphor may be applied, the characteristics of obtained light may be different.

Figure 4:
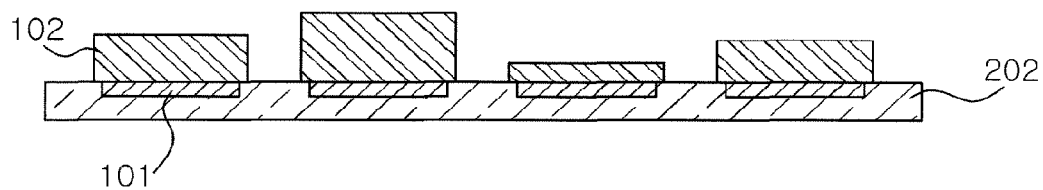

In the present exemplary embodiment, the influence due to the thickness deviation (or variation) of the substrate 101 is minimized. To this end, as shown in FIG. 4, a plurality of light emission structures are transferred on a second carrier sheet 202 such that the light emitting elements 101 are arranged to face the second carrier sheet 202. In this case, in order to minimize the influence of the thickness of the substrate 102, at least a portion of each of the light emitting elements 101 is buried in the second carrier sheet 202, so one surface of the substrate 102 may be in contact with the second carrier sheet 202. A UV sheet may be used as the second carrier sheet 202, and after the light emission structures are transferred to the second carrier sheet 20, a curing process of irradiating light onto the second carrier sheet 202 may be performed to facilitate a separation of the light emitting elements 101 in a follow-up process.

Figure 5:
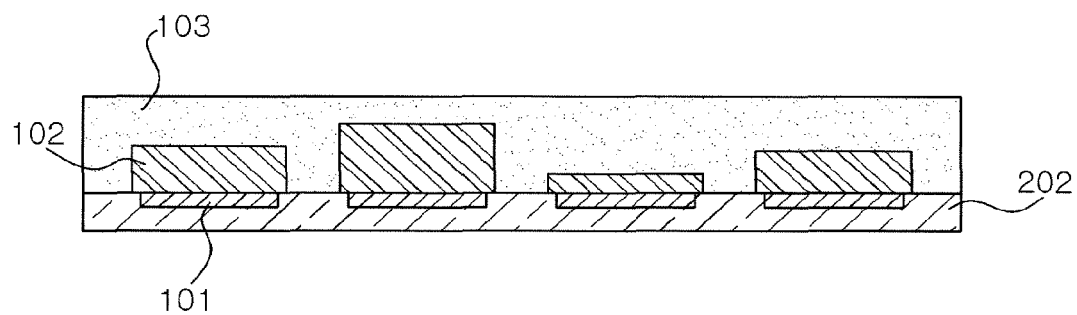

Next, as shown in FIG. 5, the reflection unit 103 is formed to cover an upper surface and a side surface of the substrate 102, and in this case, the reflection unit 103 may be integrally formed with the plurality of light emission structures. Also, when the light emitting elements 101 are buried in the second carrier sheet 202, the reflection unit 103 may be formed so as not to cover the side of the light emitting elements 101. As discussed above, the reflection unit 103 may have a structure in which a reflective filler is dispersed in a resin, and it may be formed by using a molding process conventionally known in the art. In the present exemplary embodiment, the reflection unit 103 covers the upper surfaces of the substrates 102 to have the same thickness with respect to the plurality of light emission structures, thereby implementing the device to have an overall uniform thickness in spite of the different thicknesses of the substrates 102.

Figure 6:
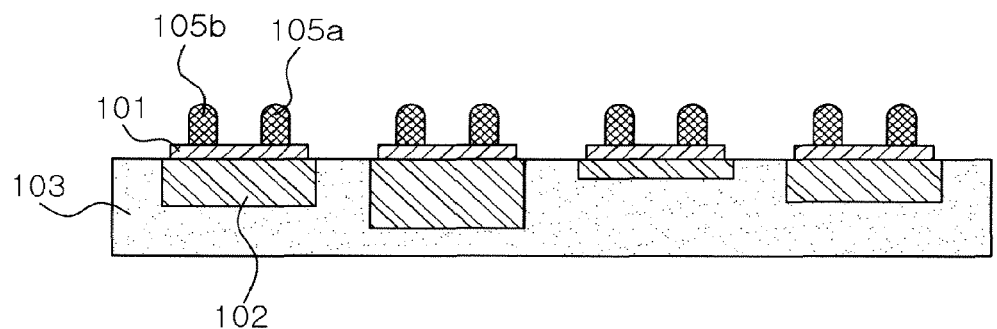

Then, as shown in FIG. 6, the first and second terminals 105a and 105b are formed to be connected to the light emitting elements 101, and this process may be performed by using a masking process, a plating process, and the like. In detail, the first and second terminals 105a and 105b are formed on at least one surface of the light emitting devices exposed by removing the second carrier sheet 202, and as mentioned above, the plurality of the light emitting elements 101 may have an upper surface with a uniform height by virtue of the reflection unit 103, even in the case that the thicknesses of the substrates 102 are different. In this case, although not shown, another carrier sheet may be used to be provided at a lower portion of the reflection unit 103 in order to remove the second carrier sheet 202 and form the first and second terminals 105a and 105b.

Figure 7:
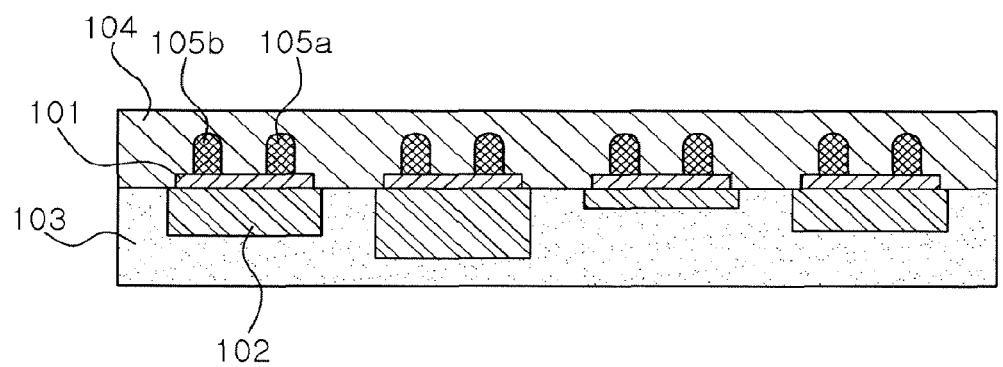

Thereafter, as shown in FIG. 7, the wavelength conversion unit 104 is formed to cover the light emitting elements 101. In this case, the wavelength conversion unit 104 may be formed to cover even the first and second terminals 105a and 105b, as well as the light emitting elements 101. Also, like the reflection unit 103, the wavelength conversion unit 104 may be integrally formed with the plurality of light emission structures. The wavelength conversion unit 104 may be obtained by applying a material formed by dispersing phosphor or quantum dots in a resin to the light emitting elements 101 and then curing the material. Alternatively, the wavelength conversion unit 104 may be separately manufactured and brought into contact with the light emitting elements 101. In the present exemplary embodiment, the plurality of light emitting elements 101 have similar light emission characteristics, and because the wavelength conversion unit 104 is provided to have the uniform thickness with respect to the plurality of light emitting elements 104, each of the light emitting devices can have white light characteristics having a minimized deviation.

Figure 8:
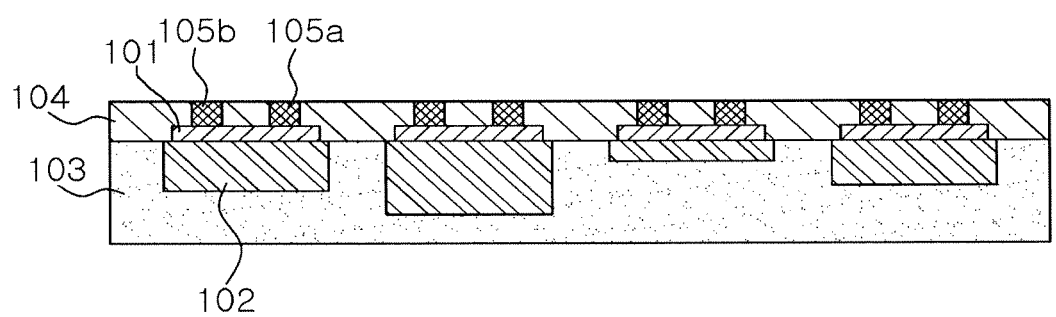
Figure 9:
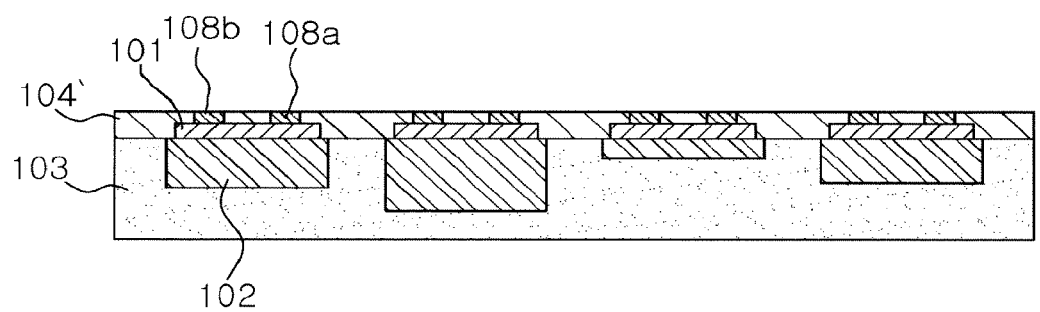

Subsequently, as shown in FIG. 8, a portion of the wavelength conversion unit 104 is removed to expose the first and second terminals 105a and 105b. In this case, if the wavelength conversion unit 104 is formed such that the first and second terminals 105a and 105b are exposed in the previous process, the current process may be omitted. In the present exemplary embodiment, portions of the first and second terminals 105a and 105b may be also removed in the process of removing the wavelength conversion unit 104, and accordingly, the upper surfaces of the wavelength conversion unit 104 and the first and second terminals 105a and 105b may be coplanar. Thereafter, the reflection unit 103 and the wavelength conversion unit 104 are cut to be divided in units of the light emitting elements 100, thus obtaining the light emitting device having the structure illustrated in FIG. 1. In the present exemplary embodiment, the process of forming the wavelength conversion unit 104 such that it is higher than the first and second terminals 105a and 105b and removing portions of the wavelength conversion unit 104 is employed, but as shown in FIG. 9, a wavelength conversion unit 104' may be selectively formed only at a desired area through a screen printing process, or the like. In this case, the process of forming the first and second terminals 105a and 105b may be omitted, and first and second electrodes 108a and 108b provided on the light emitting elements 101 may be used as terminals.

Figure 10:
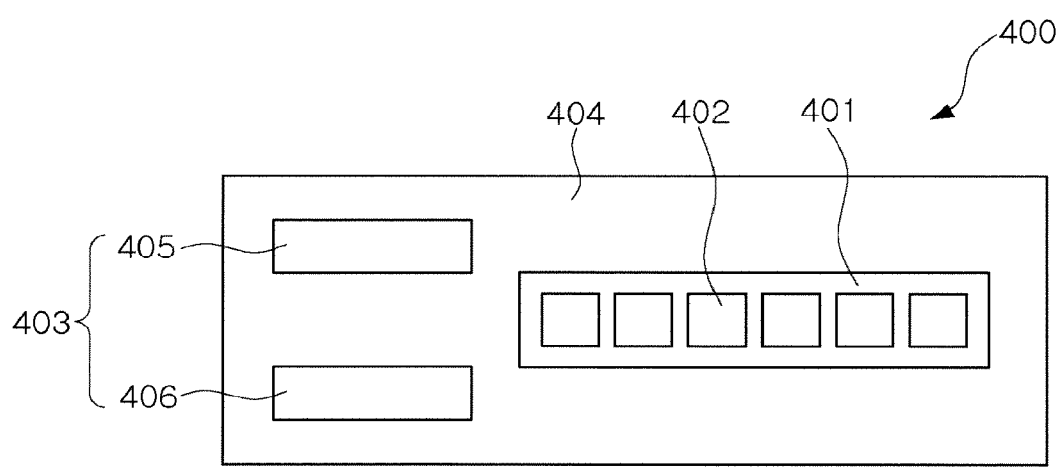
FIG. 10 is a schematic view showing an example of the use of the light emitting device according to an exemplary embodiment of the present invention.

Meanwhile, the light emitting device having the foregoing structure can be applicable to various fields. FIG. 10 is a schematic view showing an example of the use of the light emitting device according to an exemplary embedment of the present invention. With reference to FIG. 10, a lighting device (or a dimmer) 400 is configured to include a light emitting module 401, a structure 404 in which the light emitting module 401 is disposed, and a power supply unit 403. One or more light emitting devices obtained according to an exemplary embodiment of the present invention can be disposed in the light emitting module 401. In this case, the light emitting devices 402 may be mounted by themselves on the module 401 or may be provided in the form of a package. The power supply unit 403 may include an interface 405 and a power controller 406 for controlling power supply to the light emitting module 401. In this case, the interface 405 may include a fuse for breaking overcurrent and an electromagnetic shielding filter for shielding an electromagnetic interference signal.

When alternating current (AC) power is input as power, the power controller 406 may include a rectifying unit for converting the AC power into direct current (DC) power, and a constant voltage controller for converting a voltage into that suitable for the light emitting module 401, in case in which When the power itself is a DC source (e.g., a battery) having a voltage suitable for the light emitting module 401, the rectifying unit or the constant voltage controller may be omitted. Also, when the light emitting module 401 employs an element such as an AC-LED, AC power may be directly supplied to the light emitting module 401, and also in this case, the rectifying unit or the constant voltage controller may be omitted. Also, the power controller may control color temperature, or the like, to provide illumination according to human sensitivity. In addition, the power supply unit 403 may include a feedback circuit device for comparing the level of light emission of the light emitting device 402 and a pre-set amount of light and a memory device storing information regarding desired luminance, color rendering properties, or the like.

The light dimming apparatus 400 may be used as a backlight unit used for a display device such as a liquid crystal display device having an image panel, as an indoor illumination device such as a lamp, an LED flat lighting apparatus, or the like, or as an outdoor illumination device such as a streetlight, a signboard, a warning (sign) post, or the like. Also, the light dimming apparatus 400 may be used as an illumination device for various means of transportation, e.g., road vehicles, ships, aircraft, and the like. In addition, the light dimming apparatus 400 may also be used for home appliances such as a TV, a refrigerator, or the like, or medical instruments, or the like.

As set forth above, according to an exemplary embodiment of the invention, a chromaticity distribution of white light can be minimized with respect to different light emitting devices, so the light emitting devices can exhibit uniform characteristics.

According to an exemplary embodiment of the invention, a method for effectively manufacturing the foregoing light emitting devices can be accomplished.

While the present invention has been shown and described in connection with the exemplary embodiments, it will be apparent to those skilled in the art that modifications and variations can be made without departing from the spirit and scope of the invention as defined by the appended claims.

What is claimed is:

1. A method for manufacturing a light emitting device, the method comprising:
    arranging a plurality of light emitting elements on a carrier sheet;
    forming a reflection unit on at least one surface of each of the light emitting elements, wherein the at least one surface is covered by the reflection unit; and
    forming a wavelength conversion unit on an opposite surface to the at least one surface of each of the light emitting elements.

2. The method of claim 1, wherein at least portions of each of the light emitting elements are buried in the carrier sheet.

3. The method of claim 1, wherein, in the forming a wavelength conversion unit, the wavelength conversion unit is formed on the opposite surface exposed by removing the carrier sheet.

4. The method of claim 1, wherein the plurality of light emitting elements are disposed on a plurality of substrates, respectively.

5. The method of claim 4, wherein at least two of the plurality of substrates have different thicknesses.

6. The method of claim 4, wherein, in the arranging of the plurality of light emitting elements on the carrier sheet, one surface of each of the substrates is in contact with the carrier sheet.

7. The method of claim 1, wherein, in the forming of the wavelength conversion unit, the wavelength conversion unit has the same thickness with respect to each of the light emitting elements.

8. The method of claim 1, further comprising:
    forming first and second terminals on the opposite surface of each of the light emitting elements exposed by removing the carrier sheet before forming the wavelength conversion unit,
    wherein the wavelength conversion unit is formed to cover the sides of the first and second terminals.

9. The method of claim 8, wherein the forming of the wavelength conversion unit comprises:
   forming the wavelength conversion unit such that it covers the sides of the first and second terminals; and
   removing a portion of the wavelength conversion unit to expose at least upper surfaces of the first and second terminals.

10. The method of claim 9, wherein, in the removing of a portion of the wavelength conversion unit, portions of the first and second terminals are also removed.

11. The method of claim 10, wherein as the portions of the wavelength conversion unit and the first and second terminals are removed, the upper surfaces of the wavelength conversion unit and the first and second terminals are coplanar.

12. The method of claim 1, wherein, in the forming of the wavelength conversion unit, the wavelength conversion unit is integrally formed with the plurality of light emitting elements.

13. The method of claim 1, wherein each of the light emitting elements has first and second electrodes, and the wavelength conversion unit is formed to cover the side surfaces of the first and second electrodes and expose at least one surface of each of the first and second electrodes.

14. The method of claim 1, wherein, in the forming of the reflection unit, the reflection unit is formed to have the same thickness with respect to each of the light emitting elements.

15. The method of claim 1, wherein, in the forming of the reflection unit, the reflection unit is integrally formed with the plurality of light emitting elements.

* * * * *